(12) United States Patent
Zirretta

(10) Patent No.: US 11,570,885 B2
(45) Date of Patent: Jan. 31, 2023

(54) HEAT SINK FOR A PRINTED CIRCUIT BOARD

(71) Applicant: Tri-Tech International, San Clemente, CA (US)

(72) Inventor: Richard P. Zirretta, San Clemente, CA (US)

(73) Assignee: Tri-Tech International, San Clemente, CA (US)

(*) Notice: Subject to any disclaimer, the term of this patent is extended or adjusted under 35 U.S.C. 154(b) by 0 days.

(21) Appl. No.: 17/487,817

(22) Filed: Sep. 28, 2021

(65) Prior Publication Data

US 2022/0022309 A1 Jan. 20, 2022

Related U.S. Application Data

(63) Continuation of application No. 16/790,196, filed on Feb. 13, 2020, now Pat. No. 11,166,366.

(51) Int. Cl.
*H05K 1/00* (2006.01)
*H05K 1/02* (2006.01)
*G06F 1/18* (2006.01)
*H01R 12/72* (2011.01)

(52) U.S. Cl.
CPC ............ *H05K 1/021* (2013.01); *G06F 1/185* (2013.01); *H01R 12/721* (2013.01); *H05K 2201/10159* (2013.01)

(58) Field of Classification Search
CPC ............ H05K 1/021; H05K 2201/1015; G06F 1/185; H01R 12/721
See application file for complete search history.

(56) References Cited

U.S. PATENT DOCUMENTS

| 7,609,523 B1 | 10/2009 | Ni et al. |
| 7,957,134 B2 | 6/2011 | Farnsworth et al. |
| 9,252,528 B2 | 2/2016 | Stock et al. |
| 9,608,364 B2 | 3/2017 | Stock et al. |
| 2003/0026076 A1 | 2/2003 | Wei |
| 2003/0076657 A1 | 4/2003 | Summers et al. |
| 2006/0056154 A1 | 3/2006 | Foster, Sr. et al. |
| 2006/0268523 A1* | 11/2006 | Lin ............... H01L 23/4006 257/E23.102 |
| 2007/0070607 A1* | 3/2007 | Goodwin ........ H01L 23/367 257/E23.102 |
| 2007/0223198 A1* | 9/2007 | Lai ............... H01L 23/3672 361/720 |
| 2011/0286179 A1 | 11/2011 | Motschman et al. |

* cited by examiner

*Primary Examiner* — Pete T Lee
(74) *Attorney, Agent, or Firm* — Stetina Brunda Garred and Brucker

(57) ABSTRACT

A heat dissipating circuit board assembly includes a heat sink having a first wall, a second wall spaced from the first wall, and an end wall extending between the first and second walls. The first wall, the second wall, and the end wall collectively define a cavity. The assembly additionally includes a printed circuit board having a first face and a second face opposite the first face. The printed circuit board is located within the cavity such that the first wall of the heat sink extends over the first face and the second wall of the heat sink extends over the second face to allow heat to be transferred from the printed circuit board to the heat sink. The heat sink is configured to interface with a connector socket when the circuit board is connected to the connector socket for stabilizing the printed circuit board.

20 Claims, 5 Drawing Sheets

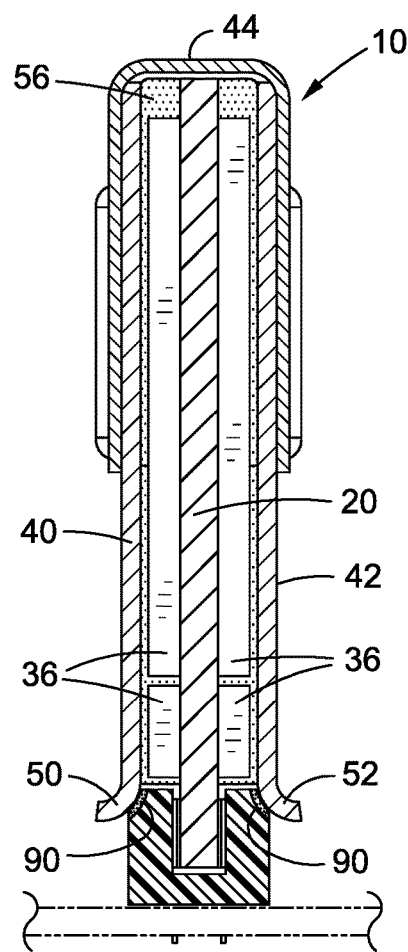
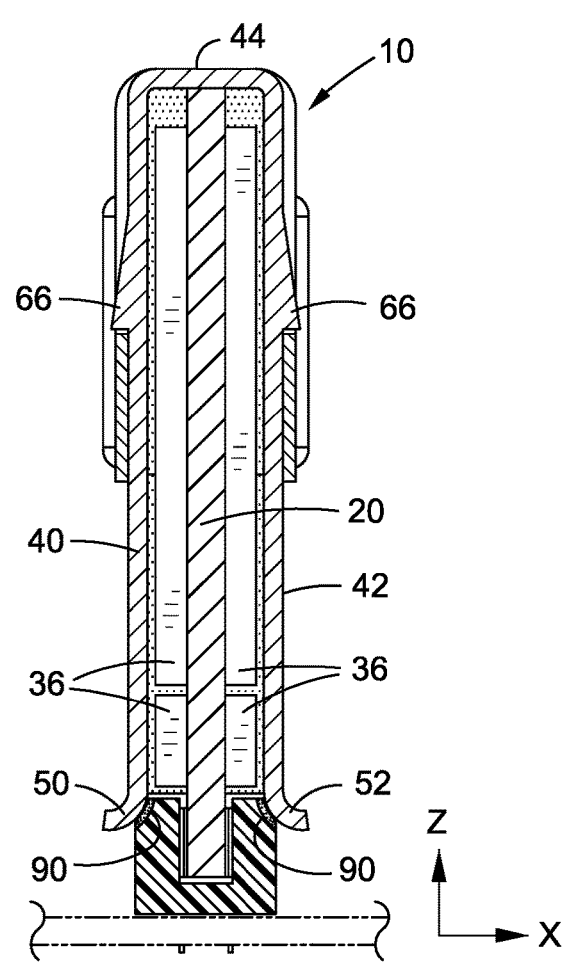
FIG. 5
FIG. 6

HEAT SINK FOR A PRINTED CIRCUIT BOARD

CROSS-REFERENCE TO RELATED APPLICATIONS

The present application is a continuation of U.S. patent application Ser. No. 16/790,196, filed on Feb. 13, 2020, the entire contents of which are incorporated herein by reference.

STATEMENT RE: FEDERALLY SPONSORED RESEARCH/DEVELOPMENT

Not Applicable

BACKGROUND

1. Technical Field

The present disclosure relates generally to a heat sink for a printed circuit board, and a more specifically to a heat sink attachable to a memory module for dissipating heat from the memory module and also for stabilizing the memory module within a connector socket on a motherboard.

2. Description of the Related Art

Many computing systems include a motherboard, e.g., mainboard, main circuit board, system board, etc., that holds and facilitates communication between several critical electrical components included in the computing system. For instance, the motherboard may include a central processor, memory modules, interface connectors, i.e., input/output devices, and other components for general purposes use and applications.

A common memory module used in computer systems is a dual in-line memory module (DIMM) that is natively 64 bits\72 bits and 128 bits\144 bits to enable fast data transfer. A DIMM may include a module that includes one or several random-access memory (RAM) chips on a small circuit board with pins (e.g. 288 pins) that connect to a connector socket on the computer motherboard. Common standard DIMMs typically have a length of approximately 5.5 inches and a height of 1.18 inches and may include unbuffered DIMMs (UDIMMs), fully-buffered DIMMs (FB-DIMMs), registered DIMMS (RDIMMs), load-reduced DIMMs (LR-DIMMs), and non-volatile DIMMs (NV-DIMMs). Other standard heights for DIMMs may include, but are not limited to 0.738 inches, 0.900 inches, 1.000 inches, 1.230 inches, and 1.500 inches. Unbuffered DIMMs are used regularly in desktop and server computers and are configured such that commands may go directly from the memory controller residing in the CPU to the memory module. Fully-buffered DIMMS are commonly employed as the main memory in systems that require large capacities, such as servers and workstations. Registered DIMMs may also be referred to as buffered memory and may be used in servers and other applications that may require robustness and stability. RDIMMs may feature an onboard memory registers that are placed between the memory and the memory controller. The memory controller may buffer command, addressing and clock cycling, and may direct instructions to the dedicated memory registers rather than directly accessing the DRAM. Load-reduced DIMMs may use isolation memory buffer (iMB) technology that buffers the data and address lanes, which may reduce the load on the memory controller. The iMB chip may also buffer data signals and may isolate electrical loading, including data signals of the DRAM chips on the DIMM from the memory controller. Non-Volatile DIMMs may refer to a hybrid computer memory that retains data during a service outage. NVDIMMs may integrate non-volatile NAND flash memory with dynamic random access memory and dedicated backup power on a single memory subsystem.

The connector socket on the motherboard may be configured to receive a DIMM, and to that end, may include a channel which receives a portion of the DIMM. A corresponding pin connector may be located in the connector socket such that placement of the memory module into the connector socket creates an electrical connection between the memory module and the connector socket. When the memory module is received within the connector socket, a frictional engagement may be created between the memory module and the connector socket. Some connector sockets may include a locking tab which may be moved into engagement with the memory module when the memory module is inserted into the connector socket for providing additional securement between the memory module and the connector socket.

During operation of the motherboard, there may be several factors which may impact operation thereof. One factor may be heat generated by the memory module. If such heat is not dissipated, the buildup of heat may affect the operation of the memory module. Furthermore, in some environments, such as military environments, the motherboard may be subjected to extreme vibrations or movement. In such environments, the memory module may become disconnected from the connector socket, which may compromise the operability of the motherboard or one or more applications running thereon.

Accordingly, there is a need in the art for a device which may allow for heat dissipation from the memory module, while also assisting in securing the memory module to the connector socket. Various aspects of the present disclosure address this particular need, as will be discussed in more detail below.

BRIEF SUMMARY

Various aspects of the present disclosure are directed toward a heat sink for a memory module mountable in a connector socket. The heat sink may be configured to extend over the memory module to allow heat to be transferred from the memory module to the heat sink, preferably through a thermal interface material. The heat sink may also be configured to engage with the connector socket when the memory module is mounted therein to stabilize the memory module relative to the connector socket. The enhanced stabilization may be particularly useful in environments subject to vibrations, such as computers used in military applications.

In accordance with one embodiment of the present disclosure, there is provided a heat dissipating circuit board assembly for use with a socket having a socket body and a socket electrical connector. The circuit board assembly includes a heat sink having a first wall, a second wall spaced from the first wall, and an end wall extending between the first and second walls. The first wall, the second wall, and the end wall collectively define a cavity. The circuit board assembly additionally includes a printed circuit board having a circuit board electrical connector connectable with the socket electrical connector. The printed circuit board additionally includes a first face and a second face opposite the first face. The printed circuit board is located within the cavity such that the first wall of the heat sink extends over the first face and the second wall of the heat sink extends over the second face to allow heat to be transferred from the printed circuit board to the heat sink. The heat sink is configured to interface with the socket body when the circuit board electrical connector is connected to the socket electrical connector for stabilizing the printed circuit board relative to the socket.

The heat sink may include a flared end portion opposite the end wall. The first wall may include a first curved end portion and the second wall may include a second curved end portion, with the first and second curved end portions extending away from each other and collectively defining the flared end portion of the heat sink. An adhesive may be connected to the flared end portion for enhancing engagement between the heat sink and the socket.

The printed circuit board may include a pair of opposed lateral faces and a pair of notches extending from respective ones of the pair of opposed lateral faces. The heat sink may include a pair of intermediate edges, with each intermediate edge extending along a respective axis that overlaps a respective one of the pair of notches. Each intermediate edge may be located between a first end axis defined by the end wall and a second end axis defined by a terminal end of the first wall or a terminal end of the second wall.

The assembly may additionally include a clip connected to the heat sink and configured to apply a first force to the first wall and a second force to the second wall, with the second force being applied in a direction opposite to that of the first force. The heat sink may include a pair of ridges extending on opposed sides of the clip. The heat sink may additionally include a locking tab interfacing with the clip to restrict removal of the clip from the heat sink.

The assembly may also include an adhesive element disposed between the printed circuit board and the heat sink. The adhesive element may include adhesive tape and/or adhesive paste.

The heat sink may be formed from aluminum.

According to another embodiment, there is provided a heat sink for use with a printed circuit board and a socket engageable with the printed circuit board, with the printed circuit board including a first face and a second face opposite the first face. The heat sink includes a first wall, a second wall spaced from the first wall, and an end wall extending between the first and second walls. The first wall, the second wall, and the end wall collectively define a cavity configured to receive the printed circuit board such that the first wall of the heat sink extends over the first face and the second wall of the heat sink extends over the second face when the printed circuit board is received within the cavity to allow heat to be transferred from the printed circuit board to the heat sink. The heat sink is configured to interface with the socket body when the printed circuit board is connected to the socket for stabilizing the printed circuit board relative to the socket.

The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which:

FIG. 5 is a cross sectional end view of the circuit board assembly taken along line 5-5 of FIG. 4;

FIG. 6 is a cross sectional end view of the circuit board assembly taken along line 6-6 of FIG. 4.

Common reference numerals are used throughout the drawings and the detailed description to indicate the same elements.

DETAILED DESCRIPTION

Figure 1:
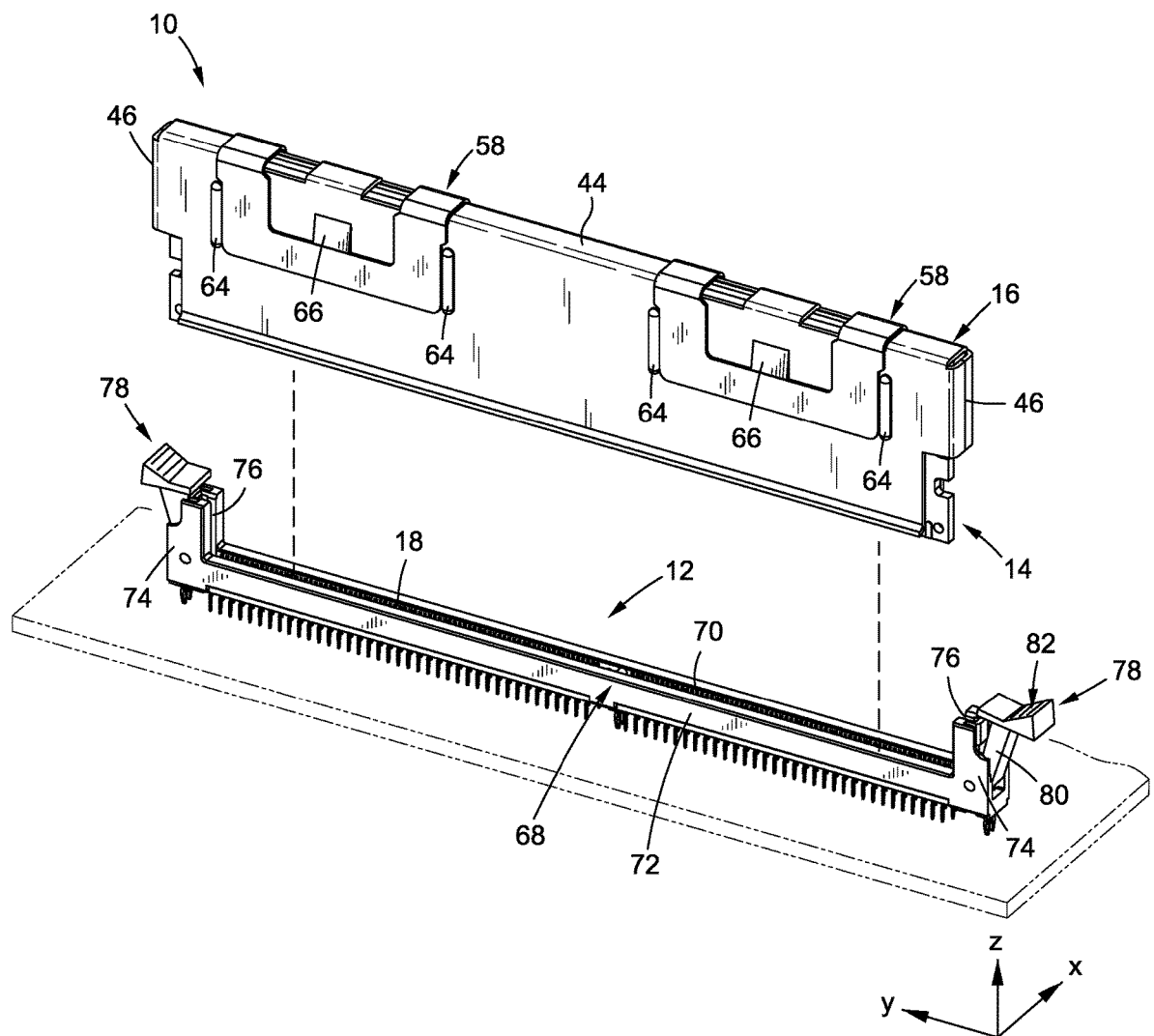
FIG. 1 is an upper perspective view of a heat dissipating circuit board assembly including a heat sink on a memory module, the circuit board assembly being aligned with a connector socket for connection therewith.

The detailed description set forth below in connection with the appended drawings is intended as a description of certain embodiments of a heat sink for a memory module that is mountable in a connector socket on a motherboard, and is not intended to represent the only forms that may be developed or utilized. The description sets forth the various structures and/or functions in connection with the illustrated embodiments, but it is to be understood, however, that the same or equivalent structure and/or functions may be accomplished by different embodiments that are also intended to be encompassed within the scope of the present disclosure. It is further understood that the use of relational terms such as first and second, and the like are used solely to distinguish one entity from another without necessarily requiring or implying any actual such relationship or order between such entities.

Referring now to the drawings, wherein the showings are for purposes of illustrating preferred embodiments of the present disclosure, and not for purposes of limiting the same, there is depicted a heat dissipating memory module assembly 10 configured to be mountable in a connector socket 12. The memory module assembly 10 includes a memory module 14 and a heat sink 16 connected to the memory module 14. The heat sink 16 may extend over the memory module 14 in proximity to the memory module 14 to allow heat generated by the memory module 14 to flow to the heat sink 16. In addition to providing heat dissipating functionality to the memory module 14, the heat sink 16 may also be configured to stabilize the memory module 14 by preventing three-dimensional movements relative to the socket 12 along the x-axis, the y-axis, and the z-axis (see FIG. 1). In this regard, the heat sink 16 may include a flared end portion that may be formed like a wing, such that when the memory module 14 is inserted into a channel 18 of the connector socket 12, the flared, wing shaped bottom may contact the connector socket 12 thereby immobilizing the memory module 14 with respect to the connector socket 12. An adhesive layer may be included on the contact surfaces of the flared end portion to adhere to the outer surface of the connector socket 12 to further assist in holding the memory module 14 in place relative to the connector socket 12. The dual functionality of the heat sink 16, i.e., heat dissipation and memory module stabilization, may be particularly desirable for memory modules 14 used in environments subjected to extreme vibrations, such as computers used in military applications.

Figure 2:
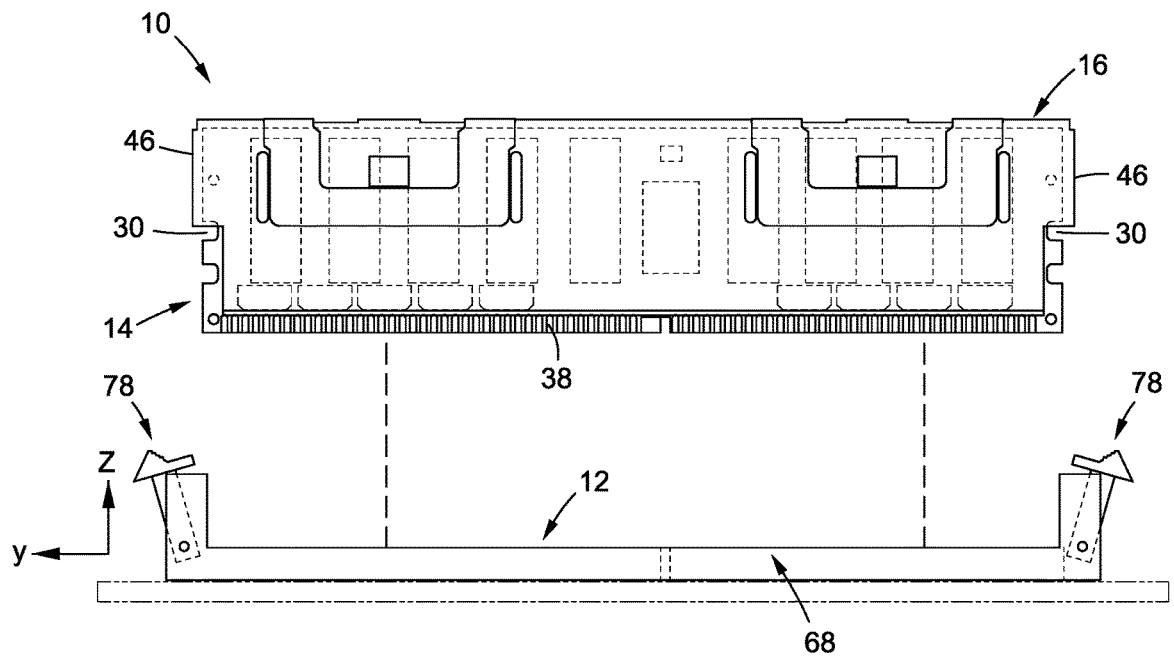
FIG. 2 is a front view of the circuit board assembly and connector socket depicted in FIG. 1.
Figure 4:
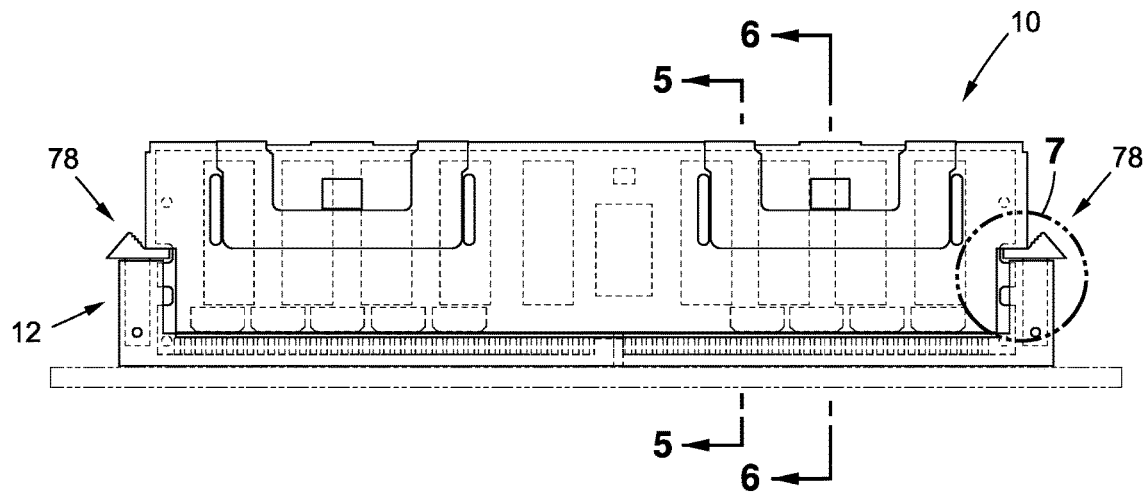
FIG. 4 is a front view of the circuit board assembly mounted to the connector socket.
Figure 3:
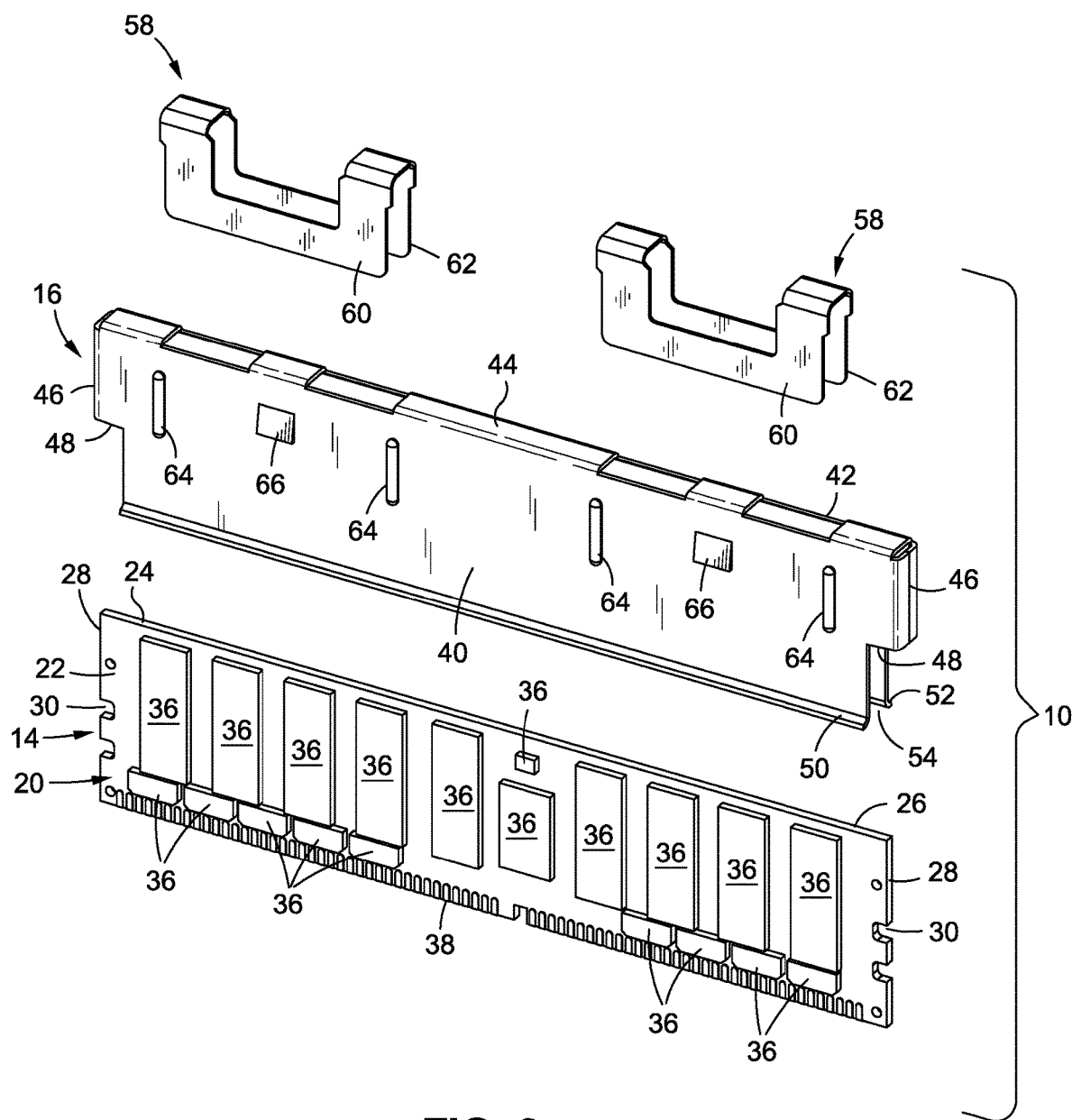
FIG. 3 is an exploded upper perspective view of the circuit board assembly.
Figure 7:
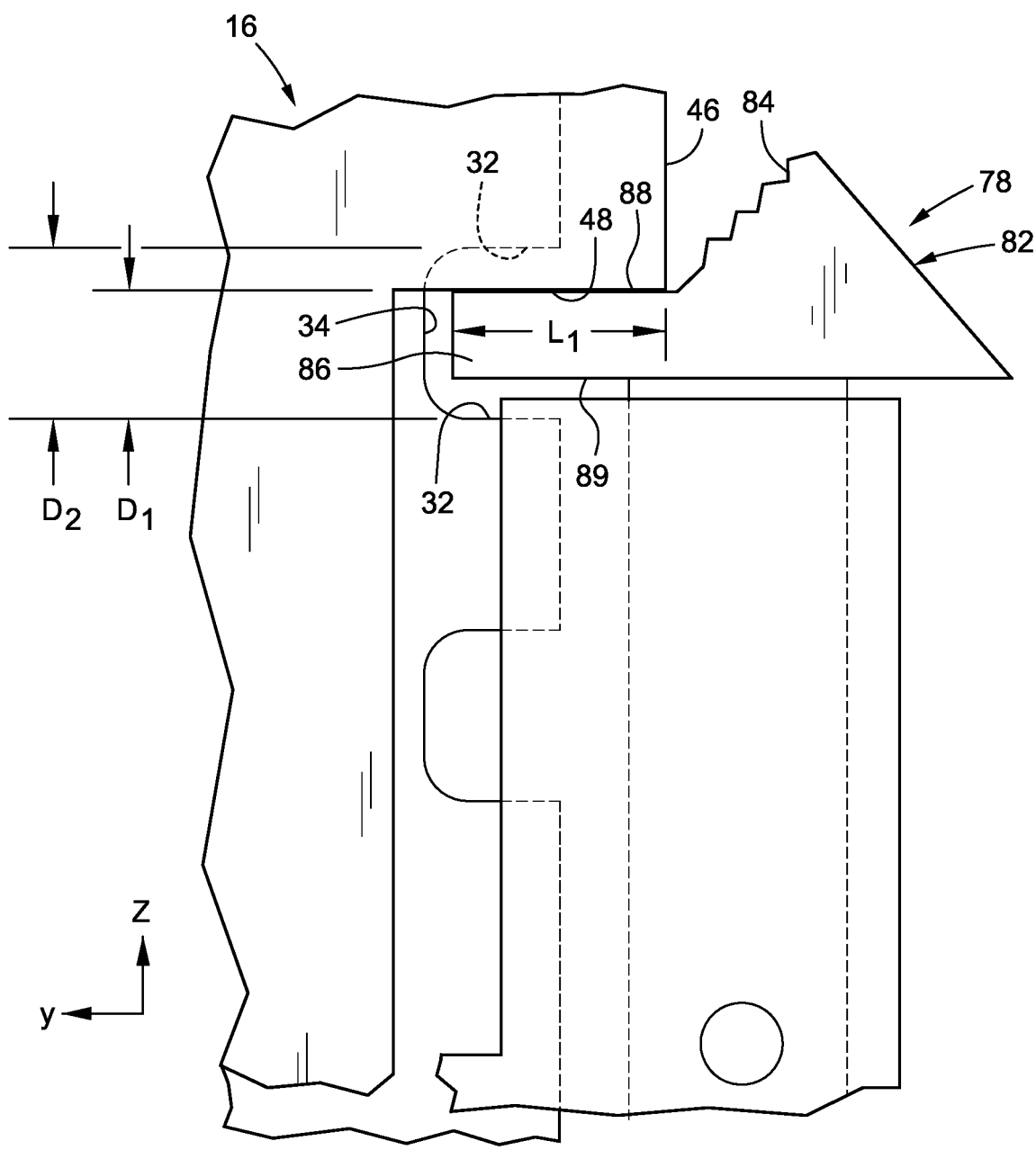
FIG. 7 is an enlarged detail view depicting engagement of a connector tab to the circuit board assembly.

FIGS. 1 and 2 shows the memory module assembly 10 detached from the connector socket 12, while FIG. 3 is an exploded view of the memory module assembly 10. The memory module 14 is a printed circuit board including a substrate 20 having a first face 22, a second face 24 opposite the first face 22, a longitudinal face 26, and a pair of opposed lateral faces 28. The substrate 20 may be formed in a generally quadrangular configuration. The memory module 14 may include notches 30 formed therein, with the notches 30 extending into the substrate 20 from the lateral faces 28 thereof. Each notch 30 may include a pair of opposed edges 32 extending into the substrate 20 from the lateral face 28, and an inner edge 34 extending between the pair of opposed edges 32. The purpose of the notches 30 will be described in more detail below.

The memory module 14 may include several electrical components 36 mounted to the first and/or second faces 22, 24. The electrical components 36 may include a dynamic random-access memory (DRAM) chip, processors, databases, or other electrical components known in the art. The memory module 14 may additionally include an electrical connector 38 formed along a peripheral edge of the substrate 20 positioned opposite to the longitudinal face 26. The electrical connector 38 may be in electrical communication with the electrical components 36 mounted on the substrate 20. In the exemplary embodiment the electrical connector 38 is a 288-pin connector, however, it is understood that the electrical connector 38 may include a 168-pin connector, a 184-pin connector, a 240-pin connector, a 288-pin connector, or other pin connector currently known in the art or later developed in the art.

The heat sink 16 extends over the memory module 14 and is generally complementary to the configuration of the memory module 14. According to one embodiment, the heat sink 16 includes a first wall 40, a second wall 42 spaced from the first wall 40, and an end wall 44 extending between the first and second walls 40, 42. The heat sink 16 may additionally include a pair of lateral walls 46 extending between the first and second walls 40, 42 and positioned adjacent the end wall 44. In one embodiment, each lateral wall 46 may be formed by a pair of tabs connected to respective ones of the first and second walls 40, 42 and folded toward each other, such that the pair of tabs collectively define a given lateral wall 46. Each tab may be integrally formed with one of the first and second walls 40, 42, and may be folded relative thereto to be approximately perpendicular to the corresponding first and second wall 40, 42. Each lateral wall 46 may include an edge 48 which is positioned between the end wall 44 and an opposing distal end of the heat sink 16, and thus, the edge 48 may be referred to as an intermediate edge. In one embodiment, at least a portion of the intermediate edge 48 may be generally perpendicular to the lateral wall 46, and generally parallel to the end wall 44. The importance of the intermediate edge 48 will be described in more detail below.

The heat sink 16 may include a flared end portion opposite the end wall 44. In this regard, the first wall 40 may include a first planar portion extending from the end wall 44, and a first curved end portion 50 extending away from the second wall 42. The first curved end portion 50 may extend longitudinally in spaced, generally parallel relation to the end wall 44. Similarly, the second wall 42 may include a second planar portion extending from the end wall 44 in generally parallel relation to the first planar portion, and second curved end portion 52 extending away from the first wall 40. The second curved end portion 52 may extend longitudinally in spaced, generally parallel relation to the end wall 44 and the first curved end portion 50. The first and second curved end portions 50, 52 may extend away from each other and may collectively define the flared end portion of the heat sink 16. The flared end portion may be configured to engage with the connector socket 12 to provide stabilization to the memory module 14, as will be described in more detail below.

The heat sink 16 may be formed from aluminum or other materials known in the art exhibiting desirable heat transfer material characteristics.

The heat sink 16 may define a cavity 54 which is sized to receive the memory module 14. In one embodiment, the cavity 54 is collectively defined by the first wall 40, the second wall 42, the end wall 44, and the pair of lateral walls 46. The width of the cavity 54, i.e., the distance between the inner surfaces of the first and second walls 40, 42, may be slightly larger than the width of the memory module 14, e.g., the maximum distance defined by opposing surfaces generally parallel to the first and second faces 22, 24. In this regard, the width of the memory module 14 may be defined by opposing electrical components 36, and/or the first and second faces 22, 24.

The memory module 14 may be inserted into the heat sink 16 such that the longitudinal face 26 is disposed adjacent the end wall 44, and the first wall 40 extends over the first face 22 and the second wall 42 extends over the second face 24. The electrical connector 38 on the memory module 14 may protrude out of the cavity 54 and may remain exposed to allow for connection with the socket 12. When the memory module 14 is completely inserted into the heat sink 16, the intermediate edges 48 of the heat sink 16 may overlap with one of the notches 30 formed on the substrate 20. In other words, with each intermediate edge 48 may extend along a respective axis that overlaps a respective one of the pair of notches 30. Thus, the resultant clearance defined collectively by a first edge 38 of the notch 30 and the corresponding intermediate edge 48 of the heat sink 16 (i.e., D1) is smaller than the distance defined by the pair of opposed edges 32 of the notch 30 (i.e., D2). The amount of over-hang of the heat sink 16 relative to the notch 30 may be equal to D2−D1. The importance of this reduction in clearance will be described in more detail below.

An adhesive 56 may be used to secure the heat sink 16 to the memory module 14. The adhesive 56 may include a thermal tape or a thermal paste, which may act as a thermal conductor to facilitate heat transfer from the memory module 14 to the heat sink 16, while also acting as an electrical insulator for the electrical components 36 mounted on the substrate 20. According to one embodiment, the thickness of the adhesive 56 extending between the heat sink 16 and the electrical components 36 is between 0.75 mm and 1.75 mm, and more preferably 1.25 mm.

The memory module 14 may also be secured to the heat sink 16 through the use of one or more clips 58 externally attachable to the heat sink 16 for applying a compressive force to the heat sink 16. Each clip 58 may include a first side 60 and a second side 62 opposite the first side 60. The first and second sides 60, 62 define a width therebetween, with the width being equal to a first distance when the clip 58 is detached from the heat sink 16 and is allowed to assume a neutral configuration. The clip 58 may be resilient so as to allow the width to vary and depart from the neutral configuration. However, when the clip 58 transitions from the neutral position, the clip 58 is biased to return to the neutral configuration. Thus, the clip 58 is configured such that it defines a width having a first distance (e.g., at its neutral position) that is slightly smaller than the external width of the heat sink 16. In this regard, in order to place the clip 58 on the heat sink 16, with the first side 60 extending over the first wall 40 and the second side 62 extending over the second wall 42, expansion of the clip width is required to extend over the heat sink 16. Therefore, when the clip 58 is placed on the heat sink 16, the biasing force associated with the clip 58 applies a compressive force on the heat sink 16 to secure the heat sink 16 to the memory module 14. In particular, a first force is applied to the first wall 40 and a second force to the second wall 42, with the second force being applied in a direction opposite to that of the first force.

The heat sink 16 may include several pairs of ridges 64 for positioning the clip 58 on the heat sink 16. In the exemplary embodiment, the heat sink 16 includes two pairs of ridges 64 protruding outwardly (e.g., away from the cavity) from the first wall 40, and two pairs of ridges 64 protruding outwardly from the second wall 42. Each clip 58 is centered by a pair of ridges 64 on the first face 22 and a pair of ridges 64 on the second face 24. The ridges 64 may prevent the clips 58 from sliding over the outer surface of the heat sink 16.

The heat sink 16 may additionally several unidirectional locking tabs 66 configured to retain the clips 58 on the heat sink 16. Each locking tab 66 may be formed with one of the first and second walls 40, 42 and may be located between a given pair of ridges 64. Each locking tab 66 may include a proximal end positioned adjacent the end wall 44 and a distal end extending away from the end wall 44. Each locking tab 66 may further be angled relative to the respective first and second wall 40, 42 such that the distal end protrudes away from the respective first and second wall 40, 42. When the clip 58 is placed on the heat sink 16, a portion of the clip 58 may pass over at least one locking tab 66. The width of the clip 58 may expand as it passes over the locking tab 66. When the clip 58 is pressed all the way onto the heat sink 16, the portion of the clip 58 previously extending over the locking tab 66 is moved passed the locking tab 66, which allows the clip 58 to transition from its expanded configuration to its neutral configuration due to the inherent resiliency of the clip 58. The angled distal end of the locking tab 66 may interface with an edge of the clip 58 to restrict removal of the clip 58 from the heat sink 16.

The memory module 14 is configured to be connectable to the socket 12, which includes a socket body 68 and socket electrical connector 70. An exemplary socket 12 is a Molex® 288-pin memory DIMM socket. The socket electrical connector 70 may be complementary to the memory module 14, and thus, the number of pins on the socket electrical connector 70 may correspond to the number of pins included on the memory module 14. The socket body 68 may be mounted on a motherboard, e.g., a main printed circuit board included in general purpose computers and/or other expandable computing systems. The socket body 68 may be elongate and include a central portion 72 including a pair of primary walls defining the central channel 18 therebetween. Referring to FIG. 1, the central portion 72 defines a Y-axis, which extends parallel to the central channel 18. An X-axis is perpendicular to the Y-axis and may pass through both the primary walls of the central portion 72. A Z-axis is perpendicular to the X-axis and the Y-axis.

The socket electrical connector 70 is connected to the primary walls, located within the central channel 18, and electrically connectable to the electrical connector 38 on the memory module 14 when the memory module 14 is connected to the socket 12. The socket electrical connector 70 may be in electrical communication with other electrical components 36 on the motherboard.

The socket body 68 may additionally include a pair of lateral supports 74 extending from respective ends of the central portion 72, with each lateral support 74 including a guide slot 76 extending in generally perpendicular relation to the central channel 18, while also being in communication with the central channel 18. The guide slot 76 is configured to receive the memory module 14 and guide the memory module 14 into the channel 18 when connecting the memory module 14 to the socket 12.

The socket 12 may additionally include a pair of locking members 78 at opposed end portions thereof and configured to be engageable with the substrate 20 when the memory module 14 is connected to the socket 12. Each locking member 78 is pivotally connected to one of the lateral supports 74 and includes a pivot shaft 80 and a head 82 connected to the pivot shaft 80. The head 82 includes a finger grip 84 and a locking body 86. The locking body 86 is configured to be received in a respective notch 30 formed on the substrate 20 when the memory module 14 is connected to the socket 12. The locking body 86 includes a pair of opposed surfaces 88, 89 which are sized to fit within the reduced clearance (i.e., D1) defined by the overlapping configuration of the heat sink 16 and the notches 30 to create a tight, secure fit.

Each locking member 78 may be pivotable relative to the socket body 68 between an unlocked configuration and a locked configuration. The locking member 78 is moved to the unlocked configuration to allow for insertion of the memory module 14 into the connector socket 12, or removal of the memory module 14 from the connector socket 12. The locking member 78 is moved to the locked position when the memory module 14 is completely inserted into the socket body 68 to retain the memory module 14 therein. According to one embodiment, each locking member 78 may pivot relative to the socket body 68 by a magnitude of less than 90 degrees as the locking member 78 transitions between the locked and unlocked positions.

To connect the memory module assembly 10 to the socket 12, the exposed lateral faces 28 of the substrate 20 are aligned with respective guide slots 76 formed on the lateral supports 74. The memory module assembly 10 is then pressed toward the socket body 68 along the Z-axis until the memory module assembly 10 assumes an inserted position relative to the socket 12. In the inserted position, the electrical connector 38 on the memory module 14 is in electrical communication with the electrical connector 70 on the socket 12. Furthermore, when the memory module assembly 10 is in the inserted position, the flared end portion of the heat sink 16 may contact an outer surface of the socket body 68. In this regard, an adhesive 90 may be optionally connected to, or disposed on, the flared end portion for enhancing engagement between the heat sink 16 and the socket 12. The engagement between the flared end portion and the optional use of the adhesive 90 may mitigate movement of the memory module 14 relative to the socket in the X-Y plane.

When the memory module assembly 10 is in the inserted position, the locking members 78 may be transitioned from their unlocked positions toward their locked positions. As the locking members 78 assume the locked position, the locking body 86 is received within the notch 30, with the surface 88 of the locking body 86 being disposed between an intermediate edge 48 on the heat sink 16 and an edge 32 formed on the substrate 20. In this regard, the distance between the opposed surfaces 88, 89 on the locking body 86 are spaced by substantially the same distance as the separation between the intermediate edge 48 of the heat sink 16 and the opposing edge on the substrate 20 (e.g., D1). In this regard, the slight dimensional difference between the effective size of the notch (e.g., D1) and the size of the locking body 86 allows the locking member 78 to transition between the unlocked position and the locked position when the memory module assembly 10 is in the inserted position, while at the same time interface with the intermediate edge 48 on the heat sink 16 and the opposing edge along the notch to minimize movement of the memory module assembly 10 in a direction perpendicular to the channel 18 (e.g., restricts movement of the memory module assembly 10 in the Z-axis). In one embodiment, the surface 88 of the locking body 86 is in face-to-face contact with the intermediate edge 48 of the heat sink 16 when the locking member 78 is in the locked position. The face-to-face contact may extend along a length, Li defined by the contacting portions of the edge 48 and surface 88. Thus, the contact between the surface 88 and the intermediate edge 48 may restrict movement of the memory module assembly 10 relative to the socket 12 along the z-axis.

According to one embodiment, the temperature of the outer surfaces of the electrical components 36 should be around 70-85 degrees Celsius for normal operations. The use of the thermal adhesive between the electrical components 36 and the heat sink 16 helps to dissipate the heat. Furthermore, the heat sink 16 may be capable of expelling a minimum of 8%-12% of the heat.

Although the foregoing describes the heat sink 16 as being used in connection with a memory module 14, it is understood that the use of the heat sink 16 may not be limited thereto. In this regard, the heat sink 16 may be used with any printed circuit board that may be connected to a connector socket.

The particulars shown herein are by way of example only for purposes of illustrative discussion, and are not presented in the cause of providing what is believed to be most useful and readily understood description of the principles and conceptual aspects of the various embodiments of the present disclosure. In this regard, no attempt is made to show any more detail than is necessary for a fundamental understanding of the different features of the various embodiments, the description taken with the drawings making apparent to those skilled in the art how these may be implemented in practice.

What is claimed is:

1. A heat dissipating circuit board assembly for use with a socket having a socket body and a socket electrical connector, the circuit board assembly comprising:
   a heat sink having a first wall, a second wall spaced from the first wall, and an end wall extending in a first direction between the first and second walls and in a second direction perpendicular to the first direction to define a heat sink length, the first wall, the second wall, and the end wall collectively defining a cavity; and
   a printed circuit board having a circuit board electrical connector connectable with the socket electrical connector, a first face, a second face opposite the first face, and a pair of opposed lateral edges to define a circuit board length shorter than the heat sink length, the printed circuit board being located within the cavity such that the first wall of the heat sink extends over the first face and the second wall of the heat sink extends over the second face to allow heat to be transferred from the printed circuit board to the heat sink;
   the heat sink being configured to interface with the socket body when the circuit board electrical connector is connected to the socket electrical connector for stabilizing the printed circuit board relative to the socket.

2. The assembly recited in claim 1, wherein the heat sink includes a flared end portion opposite the end wall.

3. The assembly recited in claim 2, wherein the first wall includes a first curved end portion and the second wall includes a second curved end portion, the first and second curved end portions extending away from each other and collectively defining the flared end portion of the heat sink.

4. The assembly recited in claim 2, further comprising an adhesive connected to the flared end portion for enhancing engagement between the heat sink and the socket.

5. The assembly recited in claim 1, wherein the printed circuit board further includes a pair of opposed lateral faces and a pair of notches extending from respective ones of the pair of opposed lateral faces.

6. The assembly recited in claim 5, wherein the heat sink includes a pair of intermediate edges, each intermediate edge extending along a respective axis that overlaps a respective one of the pair of notches.

7. The assembly recited in claim 6, wherein each intermediate edge is located between a first end axis defined by the end wall and a second end axis defined by a terminal end of the first wall or a terminal end of the second wall.

8. The assembly recited in claim 1, further comprising a clip connected to the heat sink and configured to apply a first force to the first wall and a second force to the second wall, the second force being applied in a direction opposite to that of the first force.

9. The assembly recited in claim 8, wherein the heat sink includes a pair of ridges extending on opposed sides of the clip.

10. The assembly recited in claim 9, wherein the heat sink further includes a locking tab interfacing with the clip to restrict removal of the clip from the heat sink.

11. The assembly recited in claim 1, further comprising an adhesive element disposed between the printed circuit board and the heat sink.

12. The assembly recited in claim 11, wherein the adhesive element includes adhesive tape.

13. The assembly recited in claim 11, wherein the adhesive element includes adhesive paste.

14. The assembly recited in claim 1, wherein the heat sink is formed from aluminum.

15. A heat sink for use with a printed circuit board and a socket engageable with the printed circuit board, the printed circuit board including a first face and a second face opposite the first face, the heat sink comprising:
   a first wall;
   a second wall spaced from the first wall; and
   an end wall extending between the first and second walls;
   a pair of lateral walls extending in opposed relation to each other and generally perpendicular relative to the end wall, the first wall and second wall extending between the pair of lateral walls;
   the first wall, the second wall, and the end wall collectively defining a cavity configured to receive the printed circuit board such that the first wall of the heat sink extends over the first face and the second wall of the heat sink extends over the second face when the printed circuit board is received within the cavity to allow heat to be transferred from the printed circuit board to the heat sink;
   the heat sink being configured to interface with the socket body when the printed circuit board is connected to the socket for stabilizing the printed circuit board relative to the socket.

16. The heat sink recited in claim 15, wherein the first wall includes a first curved end portion and the second wall includes a second curved end portion, the first and second curved end portions extending away from each other.

17. The heat sink recited in claim 16, further comprising an adhesive connected to the first curved end portion and the second curved end portion for enhancing engagement between the heat sink and the socket.

18. The heat sink recited in claim 15, further comprising a clip connected to the heat sink and configured to apply a first force to the first wall and a second force to the second wall, the second force being applied in a direction opposite to that of the first force.

19. The heat sink recited in claim 18, wherein the heat sink includes a pair of ridges extending on opposed sides of the clip.

20. A circuit board assembly comprising:
a memory module including:
a heat sink having a first wall, a second wall spaced from the first wall, an end wall extending between the first and second walls, and a pair of lateral walls extending between the first wall and the second wall in perpendicular relation to the end wall, the first wall, the second wall, and the end wall collectively defining a cavity; and
a printed circuit board having a circuit board electrical connector, a first face, and a second face opposite the first face, the printed circuit board being located within the cavity of the heat sink such that the first wall of the heat sink extends over the first face and the second wall of the heat sink extends over the second face to allow heat to be transferred from the printed circuit board to the heat sink; and
a socket including:
a socket body having a channel sized to receive at least the circuit board electrical connector of the printed circuit board; and
at least one locking member pivotable relative to the socket body between a locked configuration and an unlocked configuration, the at least one locking member being in face-to-face contact with the heat sink when the circuit board electrical connector is received within the channel and the at least one locking member is in the locked configuration.

* * * * *